(12) United States Patent
Wong

(10) Patent No.: US 10,297,534 B2
(45) Date of Patent: May 21, 2019

(54) INTEGRATED CIRCUIT (IC) PACKAGE WITH A SOLDER RECEIVING AREA AND ASSOCIATED METHODS

(71) Applicant: STMICROELECTRONICS PTE LTD, Singapore (SG)

(72) Inventor: Wing Shenq Wong, Singapore (SG)

(73) Assignee: STMICROELECTRONICS PTE LTD, Singapore (SG)

(*) Notice: Subject to any disclaimer, the term of this patent is extended or adjusted under 35 U.S.C. 154(b) by 0 days.

(21) Appl. No.: 15/949,541

(22) Filed: Apr. 10, 2018

(65) Prior Publication Data

US 2018/0226325 A1 Aug. 9, 2018

Related U.S. Application Data

(62) Division of application No. 14/567,070, filed on Dec. 11, 2014, now Pat. No. 9,972,557.

(51) Int. Cl.
| | |
|---|---|
| *H01L 23/48* | (2006.01) |
| *H01L 23/52* | (2006.01) |
| *H01L 29/40* | (2006.01) |
| *H01L 23/495* | (2006.01) |
| *H01L 23/00* | (2006.01) |
| *H01L 25/065* | (2006.01) |
| *H01L 23/31* | (2006.01) |

(52) U.S. Cl.
CPC .. *H01L 23/49513* (2013.01); *H01L 23/49575* (2013.01); *H01L 24/27* (2013.01);
(Continued)

(58) Field of Classification Search
CPC ..... H01L 2224/26175; H01L 23/49503; H01L 23/49582; H01L 23/49541; H01L 2224/32245
(Continued)

(56) References Cited

U.S. PATENT DOCUMENTS

| | | | |
|---|---|---|---|
| 5,220,200 | A | 6/1993 | Blanton |
| 5,633,535 | A | 5/1997 | Chao et al. |

(Continued)

FOREIGN PATENT DOCUMENTS

| | | |
|---|---|---|
| CN | 1466205 A | 1/2004 |
| CN | 104051401 A | 9/2014 |

(Continued)

OTHER PUBLICATIONS

Amirul et al. "Solder Short Reject Reduction in Soft Solder Die Attach (SSD) Process Using Mechanical Solder Shield Design", Applied Mechanics and Materials vol. 391 (2013) pp. 127-131.

*Primary Examiner* — Sheila V Clark
(74) *Attorney, Agent, or Firm* — Slater Matsil, LLP

(57) ABSTRACT

A single chip integrated circuit (IC) package includes a die pad, and a spacer ring on the die pad defining a solder receiving area. A solder body is on the die pad within the solder receiving area. An IC die is on the spacer ring and is secured to the die pad by the solder body within the solder receiving area. Encapsulating material surrounds the die pad, spacer ring, and IC die. For a multi-chip IC package, a dam structure is on the die pad and defines multiple solder receiving areas. A respective solder body is on the die pad within a respective solder receiving area. An IC die is within each respective solder receiving area and is held in place by a corresponding solder body. Encapsulating material surrounds the die pad, dam structure, and plurality of IC die.

26 Claims, 6 Drawing Sheets

(52) U.S. Cl.
CPC ............ *H01L 24/29* (2013.01); *H01L 24/83* (2013.01); *H01L 25/0655* (2013.01); *H01L 23/3107* (2013.01); *H01L 23/49503* (2013.01); *H01L 23/49541* (2013.01); *H01L 24/32* (2013.01); *H01L 24/48* (2013.01); *H01L 2224/26175* (2013.01); *H01L 2224/27013* (2013.01); *H01L 2224/291* (2013.01); *H01L 2224/29011* (2013.01); *H01L 2224/2919* (2013.01); *H01L 2224/29076* (2013.01); *H01L 2224/29082* (2013.01); *H01L 2224/32245* (2013.01); *H01L 2224/45099* (2013.01); *H01L 2224/48247* (2013.01); *H01L 2224/73265* (2013.01); *H01L 2224/83007* (2013.01); *H01L 2224/8314* (2013.01); *H01L 2224/83192* (2013.01); *H01L 2224/83815* (2013.01); *H01L 2924/00014* (2013.01); *H01L 2924/14* (2013.01); *H01L 2924/181* (2013.01)

(58) Field of Classification Search
USPC ....... 257/675, 701, 782, 783, 787, 786, 666, 257/676
See application file for complete search history.

(56) References Cited

U.S. PATENT DOCUMENTS

| | | | |
|---|---|---|---|
| 6,888,167 B2 * | 5/2005 | Slater, Jr. | ............ H01L 33/62 257/676 |
| 7,180,181 B2 | 2/2007 | Liu et al. | |
| 7,274,088 B2 | 9/2007 | Wu et al. | |
| 7,368,391 B2 * | 5/2008 | Tan | ............ H01L 23/13 257/E23.004 |
| 8,141,247 B2 * | 3/2012 | Pendse | ............ H01L 23/3128 257/777 |
| 8,652,880 B2 | 2/2014 | Bando et al. | |
| 9,024,424 B2 | 5/2015 | Yoshimura et al. | |
| 2002/0056894 A1 | 5/2002 | Kuo et al. | |
| 2003/0127720 A1 | 7/2003 | Fang | |
| 2003/0141582 A1 | 7/2003 | Yang et al. | |
| 2004/0207065 A1 | 10/2004 | Chang et al. | |
| 2005/0082682 A1 | 4/2005 | Liu | |
| 2010/0078791 A1 | 4/2010 | Yim et al. | |
| 2011/0045634 A1 | 2/2011 | Pagaila | |
| 2011/0275177 A1 | 11/2011 | Yim et al. | |
| 2013/0001760 A1 | 1/2013 | Ho et al. | |
| 2013/0270717 A1 | 10/2013 | Ko et al. | |
| 2014/0175681 A1 * | 6/2014 | Zhang | ............ H01L 24/32 257/787 |
| 2014/0264383 A1 | 9/2014 | Kajiwara et al. | |
| 2014/0291826 A1 | 10/2014 | Ishida | |
| 2014/0353809 A1 | 12/2014 | Shimizu et al. | |
| 2015/0318268 A1 | 11/2015 | Ahn et al. | |
| 2016/0079214 A1 | 3/2016 | Caskey et al. | |
| 2016/0172272 A1 | 6/2016 | Wong | |

FOREIGN PATENT DOCUMENTS

| | | |
|---|---|---|
| CN | 104078480 | 10/2014 |
| CN | 104103534 A | 10/2014 |
| CN | 203932042 U | 11/2014 |
| CN | 205140950 U | 4/2016 |

* cited by examiner

INTEGRATED CIRCUIT (IC) PACKAGE WITH A SOLDER RECEIVING AREA AND ASSOCIATED METHODS

CROSS-REFERENCE TO RELATED APPLICATIONS

This application is a divisional application of U.S. application Ser. No. 14/567,070, entitled "Integrated Circuit (IC) Package with a Solder Receiving Area and Associated Methods" filed on Dec. 11, 2014, which application is hereby incorporated herein by reference.

TECHNICAL FIELD

The present invention relates to the field of semiconductor packaging, and more particularly, to a die pad with a solder receiving area and related methods.

BACKGROUND

Integrated circuits typically include a leadframe and an integrated circuit (IC) die with encapsulating material surrounding the leadframe and the IC die. The leadframe includes a die pad and a plurality of pins. Soft solder may be used to attach the IC die to the die pad. Soft solder is used for thermal and electrical conductivity performance, particularly for automotive devices.

A high process temperature is needed to melt the soft solder for IC die attachment. Soft solder has a tendency to overflow beyond the area of the IC die being attached to the leadframe. This is due to the wetting between the copper leadframe and the soft solder. Solder overflow may short the pins. For a multi-chip integrated circuit, soft solder for a second IC die may overflow to the soft solder for a first IC die with re-melting when attaching the second IC die.

To prevent solder overflow, the leadframe may be formed with side walls and v-grooves. A drawback of using a leadframe package with side walls and v-grooves is that the IC die may not be level when attached to the die pad. This causes the IC die to be tilted when a thickness of the soft solder (i.e., bond line) is not uniform across the die pad. Another drawback is movement of the IC die after placement on the soft solder due to solder flow back effect.

One approach for restricting movement of the soft solder during the heating process is disclosed in U.S. published patent application no. 2002/0056894. A die pad includes a plurality of slots that extend through the die pad to restrict the soft solder. A restrictive region is defined by the slots such that the soft solder is restricted within the restrictive region. The IC die is positioned on the restrictive region. The solder paste does not flow into the slots because of the cohesion of the soft solder. As a result, the soft solder may not flow and expand during the heating process.

Another approach for preventing solder overflow from shorting the pins is disclosed in an article titled "Solder Short Reject Reduction in Soft Solder Die Attach (SSD) Process using Mechanical Solder Shield Design," by Rashid et al., Applied Mechanics and Material, Vol. 301 (2013), pp 127-131. A mechanical solder shield is integrated to the soft solder dispenser die attach machine to prevent the molten solder overflows to the lead area of the device.

SUMMARY

A single chip integrated circuit (IC) package may comprise a die pad, a spacer ring on the die pad defining a solder receiving area, a solder body on the die pad within the solder receiving area, and an IC die on the spacer ring and secured to the die pad by the solder body within the solder receiving area.

The IC package may further comprise an encapsulating material surrounding the die pad, spacer ring, and IC die. A plurality of leads may extend outwardly from the encapsulating material and be coupled to the IC die.

The spacer ring may comprise a material different than the die pad. The die pad may comprise an electrically conductive material.

The spacer ring may comprise a dry film solder mask material. The spacer ring advantageously supports the IC die, and controls a thickness of the solder body between the die pad and the IC die. This insures that the IC die will not be tilted when secured to the die pad. Another advantage of the spacer ring is that it reduces movement of the IC die due to solder flow back effect.

The spacer ring may be adhesively secured to the die pad. The IC spacer ring may be set inwardly from a periphery of the die pad. The spacer ring may also be set inwardly from a periphery of the IC die.

A method for making a single-chip IC package as described above comprises positioning a spacer ring on a die pad defining a solder receiving area, positioning a soft solder deposit on the die pad within the solder receiving area, and positioning an IC die on the spacer ring and soft solder deposit. The IC die is secured to the die pad as the soft solder deposit solidifies within the solder receiving area. The method may further comprise surrounding the die pad, spacer ring, and IC die with an encapsulating material.

Another aspect of the invention is directed to using the dry film solder mask material as a dam structure on a die pad for a multi-chip IC package. The multi-chip IC package comprises a die pad, and a dam structure on the die pad defining a plurality of solder receiving areas. There are a plurality of solder bodies, with each solder body on the die pad within a respective solder receiving area. There are a plurality of IC die, with each IC die within a respective solder receiving area and being held in place by a corresponding solder body of the plurality of solder bodies.

The multi-chip IC package may further comprise an encapsulating material surrounding the die pad, dam structure, and plurality of IC die. A plurality of leads may extend outwardly from the encapsulating material and be coupled to the plurality of IC die.

The dam structure may comprise a material different than the die pad. The die pad may comprise an electrically conductive material.

The dam structure may comprise a dry film solder mask material. The dam structure may be configured so that each solder receiving area is isolated from the other solder receiving areas. Each solder receiving area may be completely surrounded by portions of the dam structure. In addition, each IC die within a respective solder receiving area may be spaced away from the dam structure. The dam structure advantageously prevents soft solder deposits for anyone of the IC die from overflowing to an adjacent IC die. As the soft solder deposits cool they solidify to the solder bodies.

The dam structure may be adhesively secured to said die pad. The dam structure may be set inwardly from a periphery of the die pad.

A method for making a multi-chip IC package comprises positioning a dam structure on a die pad defining a plurality of solder receiving areas, and positioning a plurality of soft solder deposits on the die pad, with each soft solder deposit within a respective solder receiving area. A plurality of IC die may be positioned on the plurality of soft solder deposits, with each IC die on a respective soft solder deposit. Each IC die may be secured to the die pad as the respective soft solder deposit solidifies within a corresponding solder receiving area. The method may further comprise surrounding the die pad, dam structure, and plurality of IC die with an encapsulating material.

DETAILED DESCRIPTION OF ILLUSTRATIVE EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
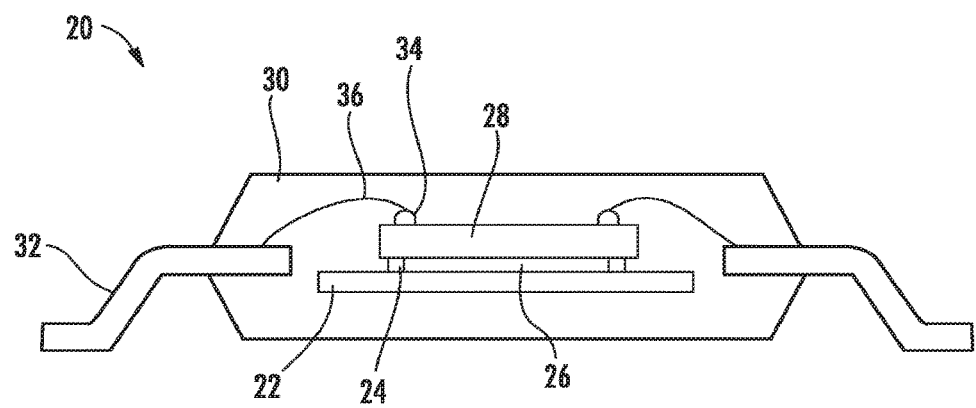
FIG. 1 is a cross-sectional side view of an integrated circuit (IC) package with a spacer ring defining a solder receiving area in accordance with the present invention.

Referring initially to FIG. 1, as integrated circuit (IC) package 20 includes a die pad 22, a spacer ring 24 on the die pad defining a solder receiving area, a solder body 26 on the die pad within the solder receiving area, and an IC die 28 on the spacer ring and secured to the die pad by the solder body within the solder receiving area.

Encapsulating materials 30 surrounds the die pad 22, spacer ring 24, and IC die 28. A plurality of leads 32 extend outwardly from the encapsulating material 30. The IC die 28 includes a plurality of bond pads 34, and there is a respective bond wire 36 coupling each of the leads 32 to a corresponding bond pad.

The spacer ring 24 is made of a material different than the material of the die pad 22. The die pad 22 is typically made out of an electrically conductive material, such as copper.

The spacer ring 24 advantageously supports the IC die 28, and controls a thickness of the solder body 26 between the die pad 22 and the IC die 28. This insures that the IC die 28 will not be tilted when secured to the die pad 22. Another advantage of the spacer ring 24 is that it reduces movement of the IC die 28 due to solder flow back effect.

Figure 2:
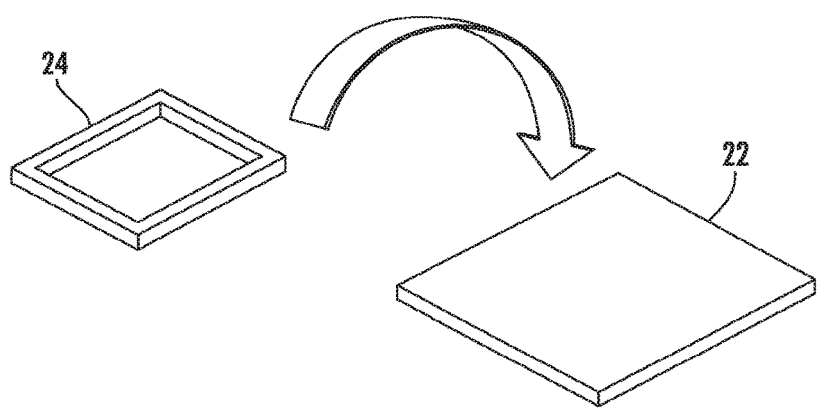
FIG. 2 is a perspective view of the spacer ring formed separate from the die pad in accordance with the present invention.

The spacer ring 24 is formed separate from the die pad 22, as illustrated in FIG. 2. The spacer ring 24 is formed by cutting or punching out the desired pattern from a dry film solder mask. An example dry film solder mask material is AUS410. A thickness of the spacer ring 24 may be within a range of 10-70 microns, for example.

The illustrated spacer ring 24 has a rectangular shape. The shape of the spacer ring 24 will vary depending on the particular application. A surface mount technology (SMT) component placement system, commonly called a pick-and-place machine, may be used to transfer the patterned spacer ring 24 to the die pad 22.

Figure 3:
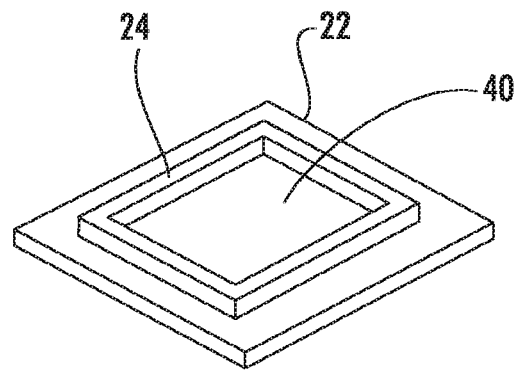
FIG. 3 is a perspective view of the spacer ring on the die pad as illustrated in FIG. 2 defining a solder receiving area.

The spacer ring 24 is adhesively secured to the die pad 22 by applying pressure at an elevated temperature, as readily appreciated by those skilled in the art. The spacer ring 24 and die pad 22 are then transferred to an oven for curing. The spacer ring 24 defines a solder body receiving area 40, as illustrated in FIG. 3.

Figure 4:
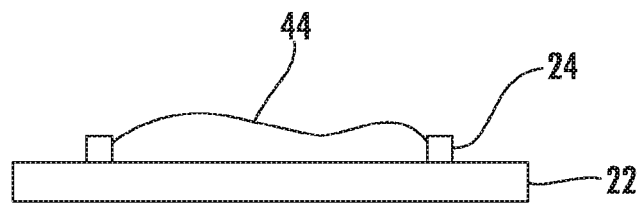
FIG. 4 is a cross-sectional side view of the spacer ring and die pad as illustrated in FIG. 3 with soft solder in the solder receiving area.

The spacer ring 24 is set inwardly from a periphery of the die pad 22. Since the height of the spacer ring 24 is known, a predetermined amount of soft solder 44 is placed in the solder receiving area 40 as defined by the spacer ring 24, as illustrated by the cross-sectional side view in FIG. 4. The soft solder 44 may also be referred to as molten solder.

Even though the soft solder extends in height above a thickness of the spacer ring 24, it is confined within the solder receiving area 40. This is because the dry film solder mask material forming the spacer ring 24 repels the soft solder. If the spacer ring 24 had been formed out of the same material as the die pad 22, i.e., copper, then soft solder would overflow the spacer ring due to a wetting effect between the soft solder and the copper. In other words, soft solder is attracted to copper while being repelled by a dry film solder mask material.

Figure 5:
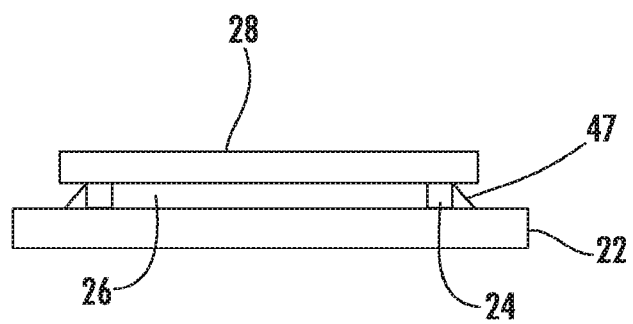
FIG. 5 is a cross-sectional side view of the spacer ring, soft solder and die pad as illustrated in FIG. 4 with the IC die on the spacer ring.

The IC die 28 is positioned on the spacer ring 24 and is secured to the die pad 22 by the soft solder 44 within the solder receiving area 40, as illustrated in FIG. 5. As the soft solder 44 cools down it solidifies into the solder body 26.

The spacer ring 24 is set inwardly from a periphery of the IC die 28. There is a small volume of overflow solder 47 on the outside of the spacer ring 24 due to placement of the IC die 28 on the spacer ring but not enough to cause a short on the pins 32.

Figure 6:
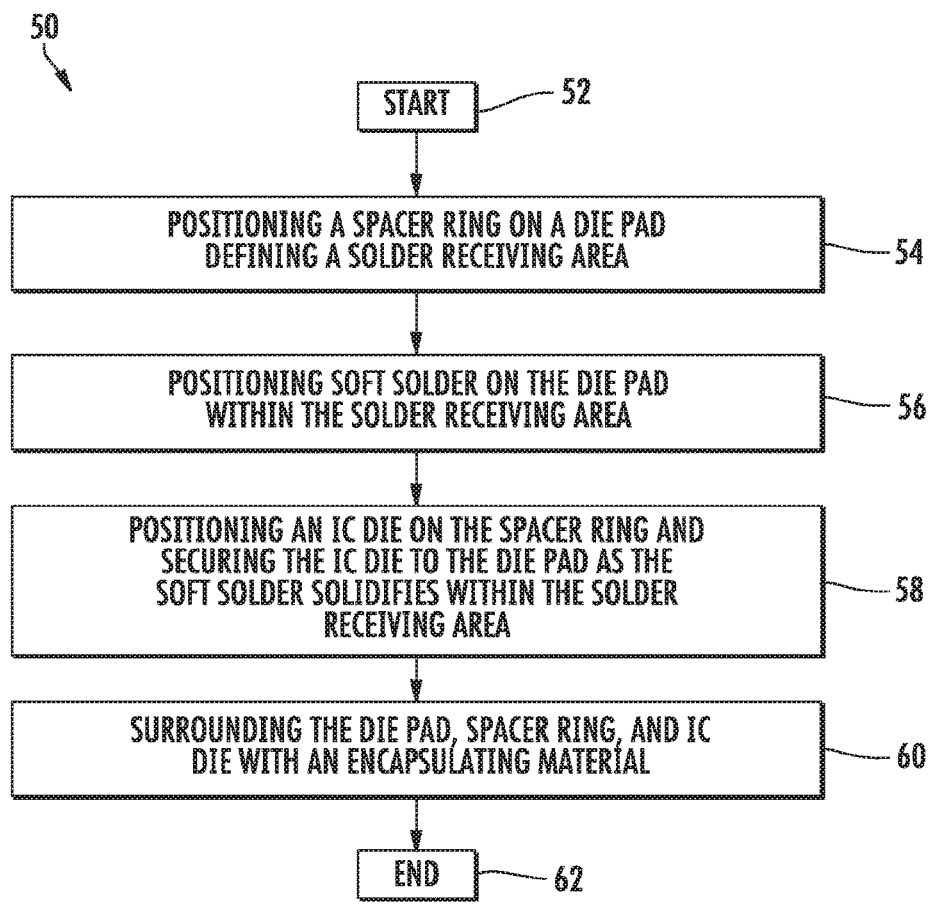
FIG. 6 is a flowchart illustrating a method for making a single-chip IC package as illustrated in FIG. 1.

Referring now to the flowchart 50 illustrated in FIG. 6, a method for making a single-chip IC package 20 will be discussed. From the start (Block 52), the method comprises positioning the spacer ring 24 on the die pad 22 to define a solder receiving area 40 at Block 54. Soft solder 44 is positioned on the die pad 22 within the solder receiving area 40 at Block 56. An IC die 28 is positioned on the spacer ring 24 and is secured to the die pad 22 as the soft solder solidifies within the solder receiving area 40 at Block 58. The die pad 28, spacer ring 24, and IC die 28 are surrounded at Block 60 with an encapsulating material. The method ends at Block 62.

Figure 7:
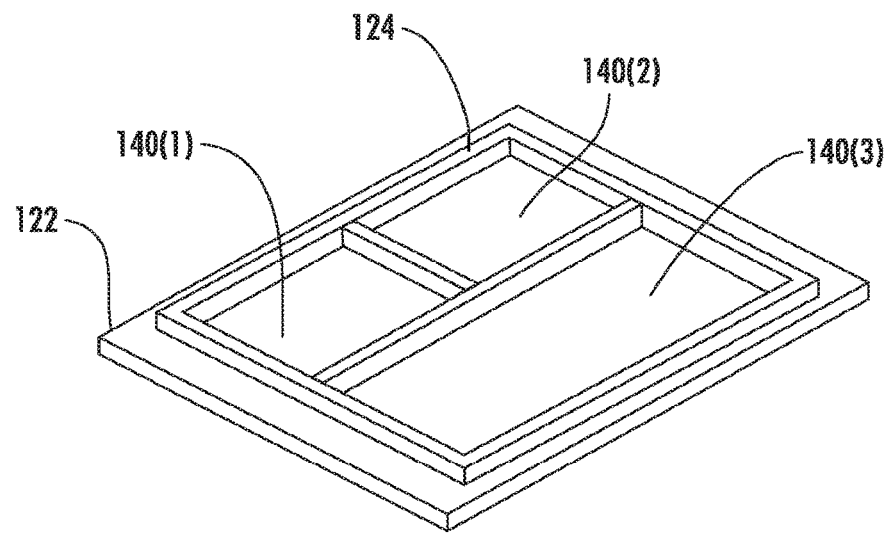
FIG. 7 is a perspective view of a dam structure on a die pad defining a plurality of solder receiving areas in accordance with the present invention.

Another aspect of the invention is directed to using the dry film solder mask material as a dam structure 124 on a die pad 122 for a multi-chip integrated circuit (IC) package, as illustrated in FIG. 7. The dam structure 124 defines a plurality of solder receiving areas 140(1), 140(2), 140(3) on the die pad 122.

The dam structure 124 is made out of material that is different than the material of the die pad 122. The die pad 122 is typically made out of an electrically conductive material, such as copper.

The dam structure 124 is formed by cutting or punching out the desired pattern from a dry film solder mask. An example dry film solder mask material is AUS410. A thickness of the dam structure 124 may be within a range of 10-70 microns, for example.

The dam structure 124 is adhesively secured to the die pad 122. This is performed by applying pressure at an elevated temperature, as readily appreciated by those skilled in the art. The dam structure 124 and die pad 122 are then transferred to an oven for curing.

The dam structure 124 is configured so that each solder receiving area 140(1), 140(2), 140(3) is isolated from the other solder receiving areas. Each solder receiving area 140(1), 140(2), 140(3) is completely surrounded by portions of the dam structure 124. A periphery of the illustrated dam structure 124 has a rectangular shape, and each solder receiving area 140(1), 140(2), 140(3) also has a rectangular shape.

Figure 8:
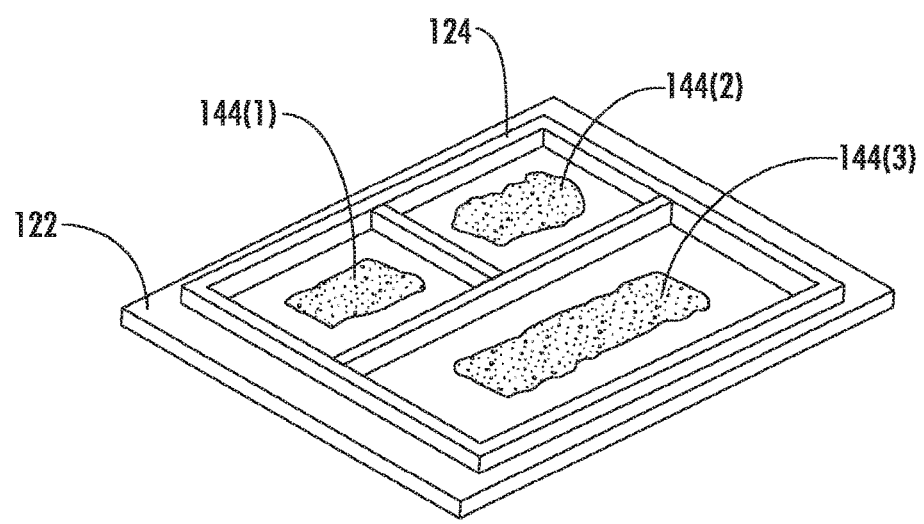
FIG. 8 is a perspective view of the dam structure and die pad as illustrated in FIG. 7 with soft solder in the solder receiving areas.

A plurality of soft solder deposits 144(1), 144(2), 144(3) are placed in the plurality of solder receiving areas 140(1), 140(2), 140(3), with each solder receiving area receiving a respective soft solder deposit, as illustrated in FIG. 8. The dam structure 124 advantageously prevents the soft solder deposits 144(1), 144(2), 144(3) for anyone of the IC die from overflowing to an adjacent IC die.

Figure 9:
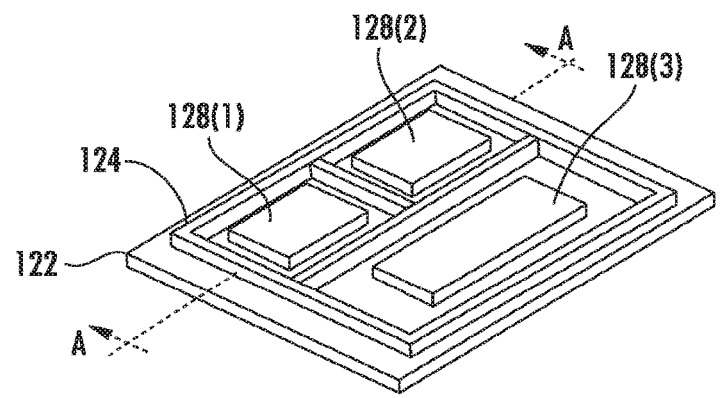
FIG. 9 is a perspective view of the dam structure and die pad as illustrated in FIG. 8 with IC die within their respective solder receiving areas.

A plurality of IC die 128(1), 128(2), 128(3) are placed on the soft solder deposits 144(1), 144(2), 144(3), with each IC die within a respective solder receiving area 140(1), 140(2), 140(3), as illustrated in FIG. 9. The soft solder deposits 144(1), 144(2), 144(3) may all be positioned on the die pad 122 before the IC die 128(1), 128(2), 128(3) are placed thereon. Alternatively, each IC die 128(1), 128(2), 128(3) is placed on a respective soft solder deposit 144(1), 144(2), 144(3) before the next soft solder deposit is positioned on the die pad 122. Each soft solder deposit solidifies to a solder body 126(1), 126(2), 126(3) as it cools so as to secure the respective IC die 128(1), 128(2), 128(3) to the die pad 122.

The dam structure 124 is set inwardly from a periphery of the die pad 122. Each IC die 128(1), 128(2), 128(3) within a respective solder receiving area 140(1), 140(2), 140(3) is spaced away from the dam structure 124.

Figure 10:
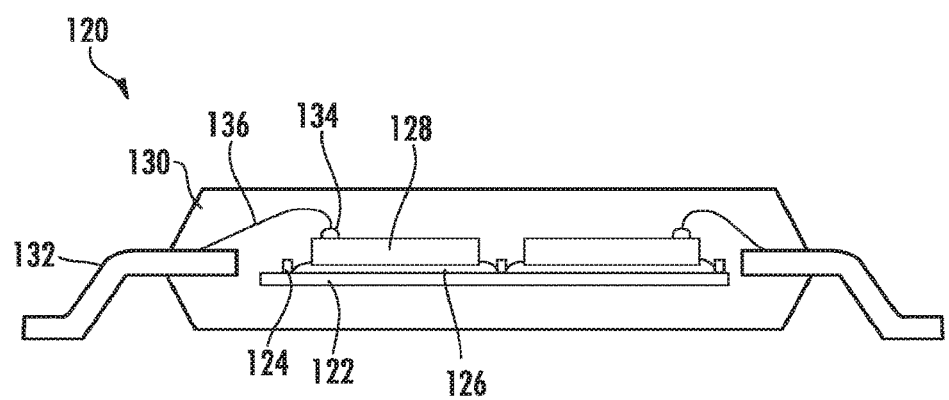
FIG. 10 is a cross-sectional side view of an integrated circuit (IC) package with the dam structure, die pad and IC die as illustrated in FIG. 9.

Encapsulating material 130 surrounds the die pad 122, dam structure 124, and IC die 128(1), 128(2), 128(3), as illustrated in FIG. 10. A plurality of leads 132 extend outwardly from the encapsulating material 130. Each IC die 128(1), 128(2), 128(3) includes a plurality of bond pads 134, and there is a respective bond wire 136 coupling each of the leads 132 to a corresponding bond pad.

Figure 11:
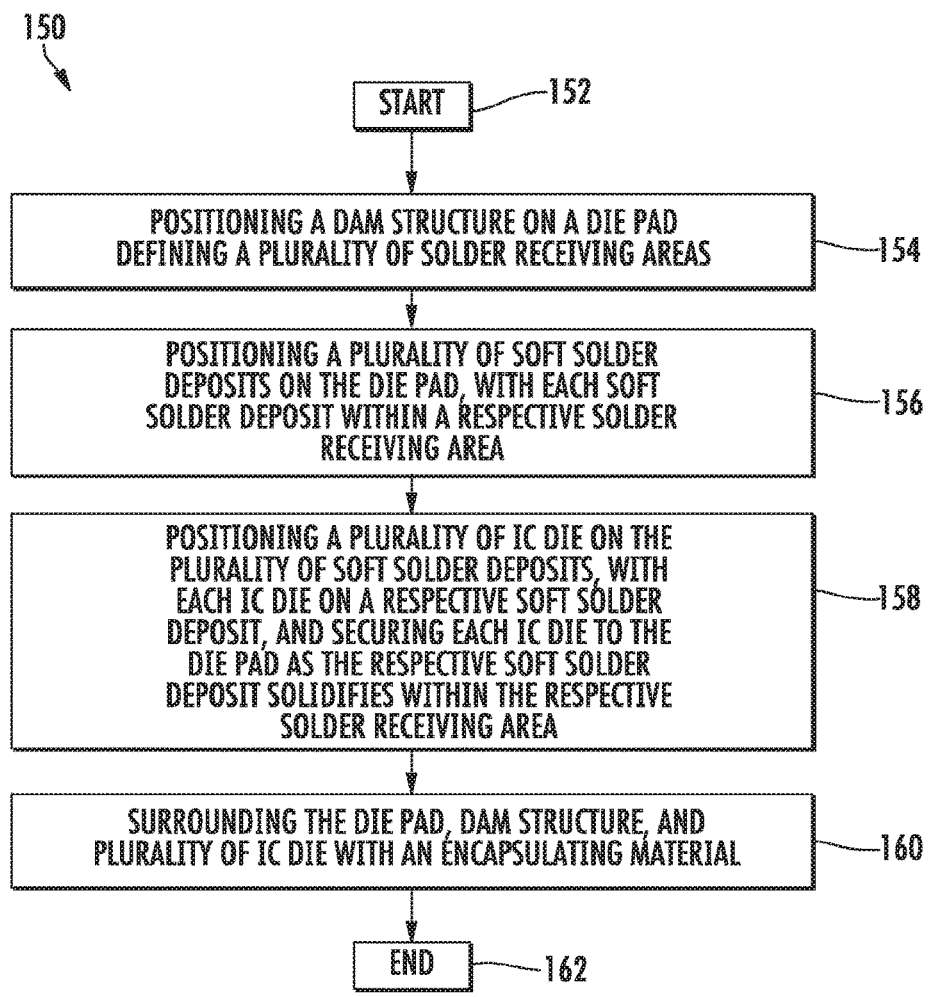
FIG. 11 is a flowchart illustrating a method for making a multi-chip IC package as illustrated in FIG. 10.

Referring now to the flowchart 150 illustrated in FIG. 11, a method for making a multi-chip IC package 120 will be discussed. From the start (Block 152), the method comprises positioning the dam structure 124 on the die pad 122 to define a plurality of solder receiving areas 140(1), 140(2), 140(3) at Block 154.

A plurality of soft solder deposits 144(1), 144(2), 144(3) are positioned on the die pad 122 at Block 156. Each soft solder deposit 144(1), 144(2), 144(3) is within a respective solder receiving area 140(1), 140(2), 140(3). A plurality of IC die 128(1), 128(2), 128(3) are positioned on the plurality of soft solder deposits 144(1), 144(2), 144(3) at Block 158.

Each IC die 128(1), 128(2), 128(3) is on a respective soft solder deposit 144(1), 144(2), 144(3). Each IC die 128(1), 128(2), 128(3) is secured to the die pad 122 as the respective soft solder deposit solidifies within a corresponding solder receiving area 140(1), 140(2), 140(3).

The die pad 122, dam structure 124, and IC die 128(1), 128(2), 128(3) are surrounded at Block 160 with an encapsulating material. The method ends at Block 162.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

What is claimed is:

1. An integrated circuit (IC) package comprising:
a die pad of a lead frame;
a dam structure disposed over the die pad and comprising a plurality of openings extending through the dam structure to the die pad, the plurality of openings comprising a plurality of solder receiving areas, wherein the dam structure comprises a material different than the die pad;
a plurality of solder bodies comprising a solder material, wherein each of the plurality of solder receiving areas comprise a solder body of the plurality of solder bodies;
a plurality of IC dies, each of the plurality of IC dies being attached to one of the plurality of solder receiving areas through a corresponding solder body of the plurality of solder bodies; and
an encapsulating material surrounding the die pad, the dam structure, and the plurality of IC dies.

2. The IC package according to claim 1, further comprising:
a major surface of each of the plurality of IC dies comprising a bond pad; and
a lead of the lead frame disposed within the encapsulating material and extending out of the encapsulating material, the lead being coupled to the bond pad.

3. The IC package according to claim 1, wherein the dam structure comprises a dry film solder mask material.

4. The IC package according to claim 1, wherein the dam structure comprises an electrically conductive material.

5. The IC package according to claim 1, wherein the dam structure is configured so that each solder receiving area is isolated from the other solder receiving areas.

6. The IC package according to claim 1, wherein each solder receiving area is completely surrounded by portions of the dam structure.

7. The IC package according to claim 1, wherein a periphery of the dam structure has a rectangular shape, and with each of the solder receiving areas also having a rectangular shape.

8. The IC package according to claim 1, wherein the dam structure is adhesively secured to the die pad.

9. The IC package according to claim 1, wherein the dam structure is set inwardly from a periphery of the die pad.

10. The IC package according to claim 1, wherein each of the plurality of IC dies within a respective one of the plurality of solder receiving areas is spaced away from the dam structure.

11. The IC package according to claim 1, further comprising a plurality of leads extending outwardly from the encapsulating material and coupled to the plurality of IC dies.

12. The IC package according to claim 11, wherein each IC die of the plurality of IC dies comprises:
a plurality of bond pads; and
a plurality of bond wires, wherein a respective bond wire of the plurality of bond wires couples each of the plurality of leads to a corresponding bond pad of the plurality of bond pads.

13. An integrated circuit (IC) package comprising:
a rectangular die pad;
a dam structure disposed over the rectangular die pad, the dam structure comprising a plurality of rectangular solder receiving areas, wherein a periphery of the dam structure comprises a rectangular shape, and the dam structure comprises a dry film solder mask material;
a plurality of solder bodies, each of the solder bodies being disposed over the die pad within a respective rectangular solder receiving area;
a plurality of IC dies, each of the plurality of IC dies disposed within the respective rectangular solder receiving area and being held in place by a corresponding solder body of the plurality of solder bodies; and
an encapsulating material surrounding the rectangular die pad, the rectangular dam structure, and the plurality of IC dies.

14. The IC package according to claim 13, wherein the dam structure comprises a continuous interior wall completely surrounding each of the plurality of rectangular solder receiving areas from all sides.

15. The IC package according to claim 13, wherein the dam structure comprises an electrically conductive material.

16. The IC package according to claim 13, wherein the dam structure is configured so that each of the plurality of rectangular solder receiving areas is isolated from the other rectangular solder receiving areas.

17. The IC package according to claim 16, wherein the dam structure is adhesively secured to the rectangular die pad.

18. The IC package according to claim 16, wherein the dam structure is set inwardly from a periphery of the rectangular die pad.

19. The IC package according to claim 16, wherein each of the plurality of IC dies is spaced away from sidewalls of the dam structure.

20. An integrated circuit (IC) package comprising:
a rectangular die pad;
a dam structure disposed over the rectangular die pad, the dam structure comprising a first rectangular solder receiving area and a second rectangular solder receiving area, wherein a periphery of the dam structure comprises a rectangular shape;
a first solder body and a second solder body, the first and the second solder bodies being disposed over the die pad within the first and the second rectangular solder receiving areas respectively;
a first and a second IC die disposed within the first and the second rectangular solder receiving areas respectively, the first IC die being held in place by the first solder body and the second IC die being held in place by the second solder body;
a first bond wire coupled to a first bond pad at a first major surface of the first IC die facing away from the die pad;
a second bond wire coupled to a second bond pad at a second major surface of the second IC die facing away from the die pad; and
an encapsulating material disposed around the rectangular die pad, the dam structure, and the first and the second IC dies, and the dam structure comprises a different material than the encapsulation material.

21. The IC package according to claim 20, wherein the dam structure comprises a continuous interior wall completely surrounding the first and the second rectangular solder receiving areas from all sides.

22. The IC package according to claim 21, wherein the first and the second IC dies are spaced away from the continuous interior wall.

23. The IC package according to claim 20, wherein the dam structure comprises an electrically conductive material.

24. The IC package according to claim 20, wherein the first rectangular solder receiving area is isolated from the second rectangular solder receiving area.

25. The IC package according to claim 20, wherein the dam structure is adhesively secured to the rectangular die pad.

26. The IC package according to claim 20, wherein the dam structure is spaced from a peripheral edge of the rectangular die pad.

* * * * *